(12) United States Patent
Shepherd

(10) Patent No.: US 6,560,860 B2
(45) Date of Patent: May 13, 2003

(54) LOW TEMPERATURE CO-FIRED CERAMIC WITH IMPROVED REGISTRATION

(75) Inventor: Paul N. Shepherd, West Lafayette, IN (US)

(73) Assignee: CTS Corporation, Elkhart, IN (US)

(*) Notice: Subject to any disclaimer, the term of this patent is extended or adjusted under 35 U.S.C. 154(b) by 42 days.

(21) Appl. No.: 09/773,049

(22) Filed: Jan. 31, 2001

(65) Prior Publication Data

US 2001/0018797 A1 Sep. 6, 2001

Related U.S. Application Data

(62) Division of application No. 09/270,346, filed on Mar. 16, 1999, now Pat. No. 6,205,032.

(51) Int. Cl.[7] ................................................ H05K 3/36
(52) U.S. Cl. ........................ 29/830; 29/831; 29/846; 29/852; 29/25.42; 156/89.11; 156/89.12
(58) Field of Search ........................ 29/830, 831, 851, 29/846, 852, 25.42; 156/89.11, 89.12; 361/790, 793, 813, 321.1, 321.2; 174/285; 438/622

(56) References Cited

U.S. PATENT DOCUMENTS

| | | | | |
|---|---|---|---|---|
| 3,852,877 A | * | 12/1974 | Ahn ............................ 29/625 |
| 4,835,656 A | * | 5/1989 | Kitahara ..................... 361/321 |
| 5,028,473 A | * | 7/1991 | Vitriol ........................ 428/137 |
| 5,597,494 A | * | 1/1997 | Kohno .......................... 216/6 |
| 5,876,538 A | * | 3/1999 | Steinle ..................... 156/89.16 |
| 5,937,321 A | * | 8/1999 | Beck .......................... 438/622 |
| 6,041,496 A | * | 3/2000 | Haq ............................. 29/852 |
| 6,165,892 A | * | 12/2000 | Chazan ....................... 438/623 |
| 6,286,204 B1 | * | 9/2001 | Sreeram et al. ............... 29/825 |

* cited by examiner

Primary Examiner—Peter Vo
Assistant Examiner—Alan Boswell
(74) Attorney, Agent, or Firm—Mark P. Bourgeois

(57) ABSTRACT

A low temperature co-fired ceramic assembly (LTCC) with a constraining core to minimize shrinkage of outer ceramic layers during firing. The outer ceramic layers have high density circuit features. A ceramic core includes several ceramic layers. Several via holes are located in the first and second ceramic layers. Several low density circuit features are located on the ceramic layers that make up the core. Outer ceramic layers are placed top and bottom of the ceramic core. The outer ceramic layers have via holes and high density circuit features. The circuit features patterned on the ceramic layers include resistors, capacitors, circuit lines, vias, inductors, or bond pads. The ceramic core is fired first in a furnace. The outer layers are then laminated to the ceramic core and fired. The ceramic core controls the shrinkage rate of the outer ceramic layers during firing allowing higher density circuit features on the outer layers.

6 Claims, 2 Drawing Sheets

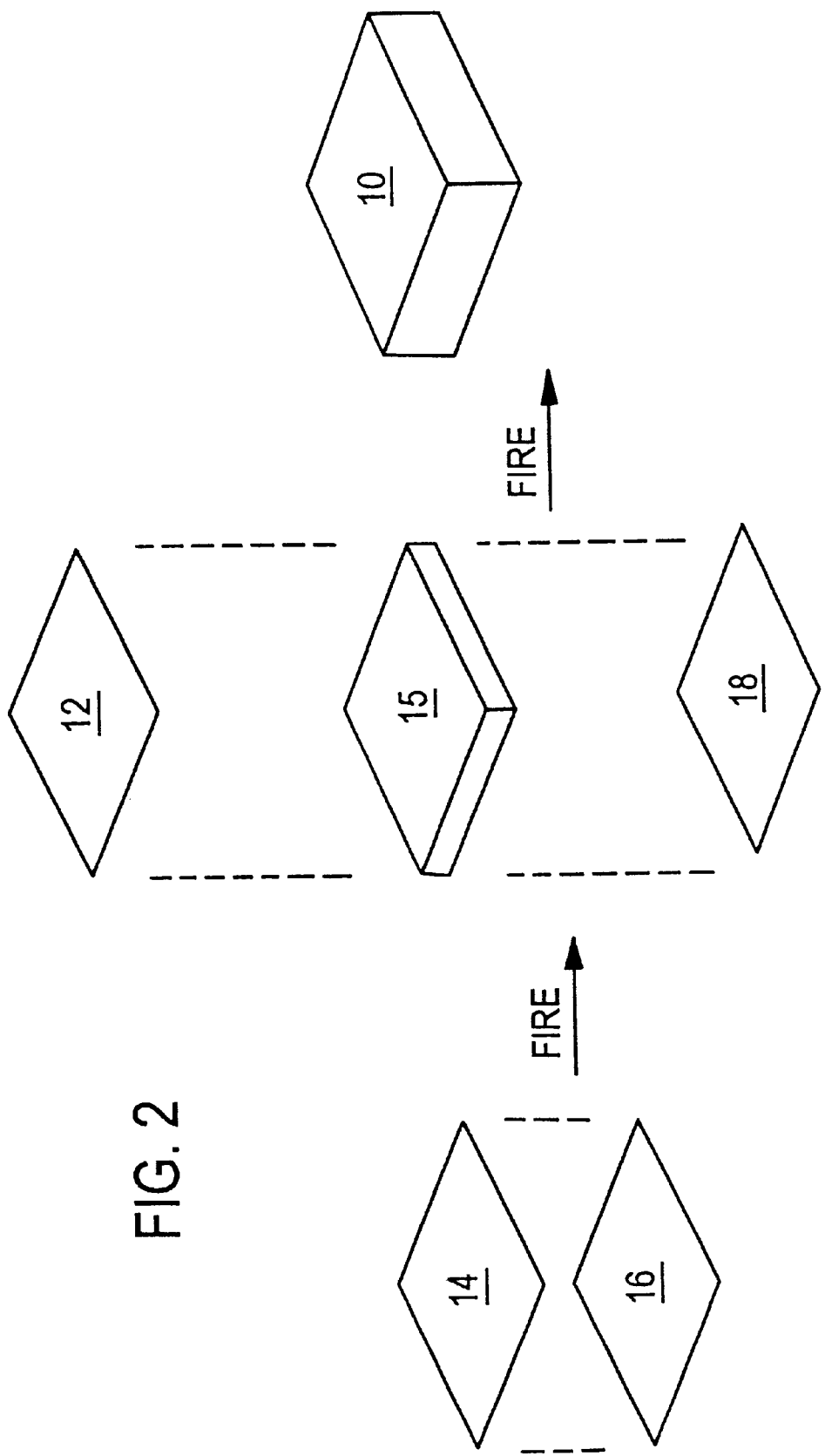

LOW TEMPERATURE CO-FIRED CERAMIC WITH IMPROVED REGISTRATION

This application is a Divisional of Application 09/270, 346, filed Mar. 16, 1999, which is now U.S. Pat. No. 6,205,032.

BACKGROUND OF THE PREFERRED EMBODIMENTS

This invention generally relates to ceramic electronic packaging. Specifically, there is a multilayered low temperature co-fired ceramic assembly (LTCC) with a constraining core to minimize shrinkage of outer ceramic layers during firing. The outer ceramic layers have high density circuit features patterned thereon.

Various devices are well known for providing ceramic packages for semiconductor devices and passive components. One of the prior art designs is a low temperature co-fired ceramic (LTCC) substrate. The LTCC ceramic is made of layers of ceramic material, which in an unfired state, are called green tapes. Circuit lines, resistors, capacitors, bonding pads and vias are created on the surface and in holes of the green tapes by conventional thick film screening techniques. The layers are stacked on top of each other laminated and fired at a relatively low temperature in a furnace. During firing, the LTCC shrinks along the x, y and z axes typically 10–20 percent depending upon the LTCC formulation.

Despite the advantages of the prior art LTCC designs, problems occur with the registration or alignment of the circuit lines and components on the exterior surfaces during manufacturing. During firing, the shrinkage of the LTCC causes the external features to vary with respect to true position. This true position error can cause misalignment when attaching components or printing post-fire materials, resulting in a defective part that is non-repairable and has to be discarded.

DESCRIPTION OF RELATED ART

Examples of a patent related to the present invention is as follows, and is herein incorporated by reference for related and supporting teachings:

U.S. Pat. No. 5,518,969, is a process for producing low shrink ceramic compositions.

The foregoing patent reflects the state of the art of which the applicant is aware and is tendered with the view toward discharging applicants' acknowledged duty of candor in disclosing information that may be pertinent in the examination of this application. It is respectfully stipulated, however, that this patent does not teach or render obvious, singly or when considered in combination, applicants' claimed invention.

SUMMARY

It is a feature of the invention to provide a low temperature co-fired ceramic assembly (LTCC) with a constraining core to minimize shrinkage of outer ceramic layers during firing.

A further feature of the invention is to provide a multilayered low temperature co-fired ceramic assembly that has high density circuit features. A ceramic core includes a first and a second ceramic layer. Several via holes are located in the first and second ceramic layers. Several low density circuit features are located on the first and second layers. A third and a fourth ceramic layers have the ceramic core located in between. The third and the fourth ceramic layers have several via holes and high density circuit features. The circuit features are selected from the group of resistors, capacitors, circuit lines, vias, inductors, or bond pads.

A further feature of the invention is to provide a method of making a multilayered low temperature co-fired ceramic assembly with high density circuit features, the method includes: providing at least a first and a second ceramic layer; punching a plurality of via holes in the first and second ceramic layers; screen printing a plurality of low density circuit features on the first and second layers; stacking the first ceramic layer onto the second ceramic layer; firing the first and second ceramic layers in a furnace such that a ceramic core is formed; providing at least a third and a fourth ceramic layer; punching a plurality of via holes in the third and fourth ceramic layers; screen printing a plurality of high density circuit features on the third and fourth ceramic layers; stacking the ceramic core onto the fourth ceramic layer and stacking the third ceramic layer onto the ceramic core; and firing the third and fourth ceramic layers and the ceramic core in a furnace such that the assembly is formed. The assembly has high density circuit features. The circuit features are selected from the group of: resistors, capacitors, circuit lines, vias, inductors, or bond pads.

The invention resides not in any one of these features per se, but rather in the particular combination of all of them herein disclosed and claimed. Those skilled in the art will appreciate that the conception, upon which this disclosure is based, may readily be utilized as a basis for the designing of other structures, methods and systems for carrying out the several purposes of the present invention. Further, the abstract is neither intended to define the invention of the application, which is measured by the claims, neither is it intended to be limiting as to the scope of the invention in any way.

BRIEF DESCRIPTION OF THE DRAWINGS

These and other features of the invention can best be understood by the following description of the accompanying drawings as follows:

FIG. 2 is a diagram showing an assembly sequence of the assembly of FIG. 1.

Figure 1:
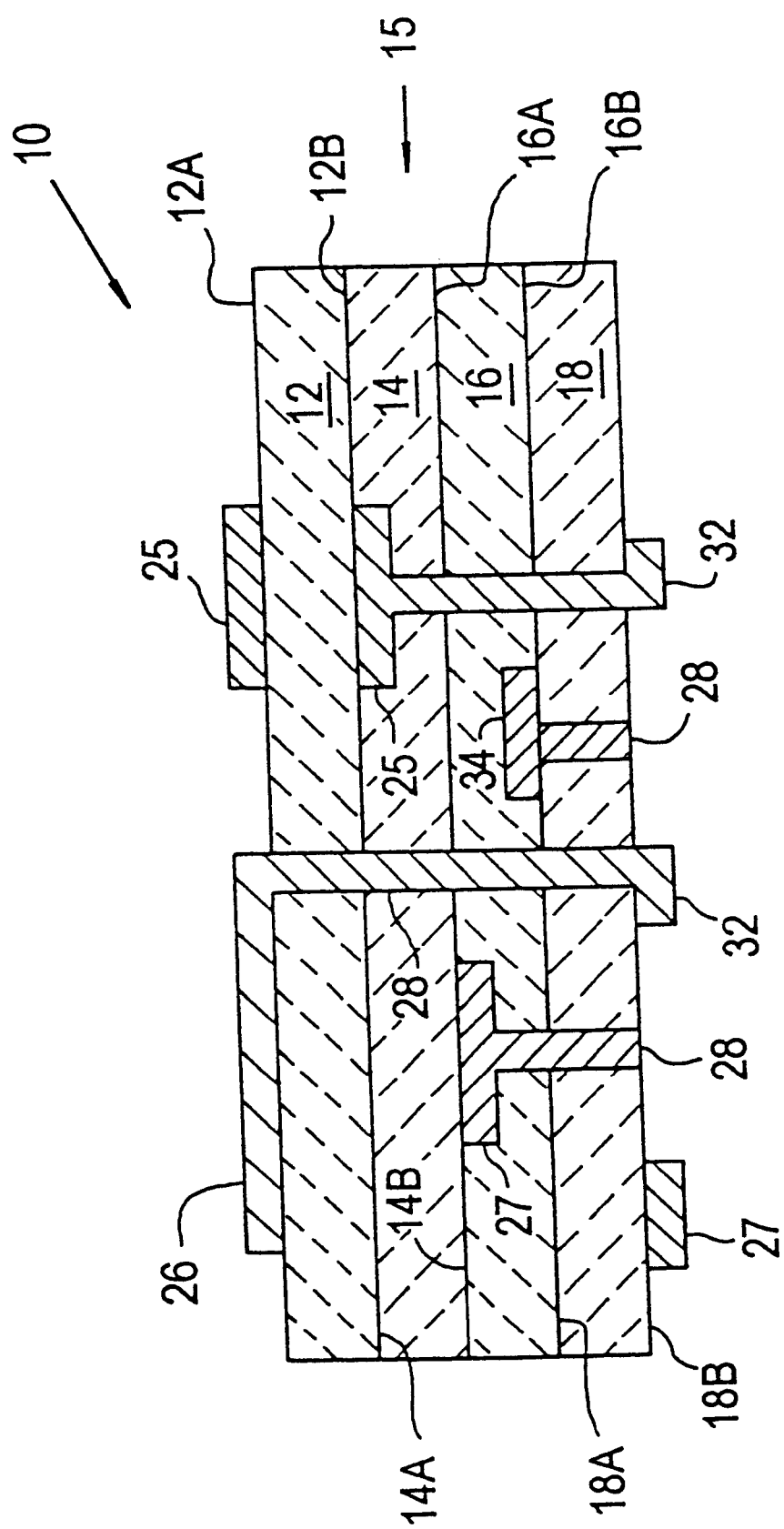
FIG. 1 is a side cross sectional view of the preferred embodiment of a low temperature co-fired ceramic assembly (LTCC) with improved registration.

It is noted that the drawings of the invention are not to scale. The drawings are merely schematic representations, not intended to portray specific parameters of the invention. The drawings are intended to depict only typical embodiments of the invention, and therefore should not be considered as limiting the scope of the invention. The invention will be described with additional specificity and detail through the accompanying drawings.

DETAILED DESCRIPTION OF THE PREFERRED EMBODIMENT

Referring to FIGS. 1 and 2, a multilayered low temperature co-fired ceramic (LTCC) assembly 10 is shown. LTCC ceramic layers 14 and 16 have outer surfaces 14A, 14B and 16A and 16B, respectively. Layers 14 and 16 are conventional LTCC green tapes. An example of layers 14 and 16 is 951 Green Tape™ commercially available from Dupont Corporation, Electronic Materials Division, Wilmington, Del. Layers 12 and 16, by themselves, shrink from 8 to 12 percent during firing in all axes.

Various circuit features and passive electronic components can be included on layers 14 and 16 if desired. The circuit features patterned on layers 14 and 16 are called non-critical or low density circuit features. They are larger in dimension, spaced farther apart and have lesser registration requirements than the circuit features on other layers. A buried resistor 27 is shown on surface 16A. A via 28 connects resistor 27 with bottom surface 18B. A buried inductor 34 is shown on surface 16B. Another via 28 connects inductor 34 to bottom surface 18B. These are some examples of the circuit features and components that can be fabricated on assembly 10. Resistors 27, inductor 34 and vias 28 are made from conventional thick film conductor materials and are applied by conventional thick film screening and curing techniques. After circuit features have been applied, layers 14 and 16 would be stacked on top of each other or laminated and fired in a furnace to form a ceramic core 15.

LTCC ceramic layers 12 and 18 have outer surfaces 12A, 12B and 18A and 18B, respectively. Layers 12 and 18 are conventional LTCC green tapes. An example of layers 12 and 18 is 951 Green Tape™ commercially available from Dupont Corporation, Electronic Materials Division, Wilmington, Del. An electrode 25 is located on surface 12A. Another electrode is located on surface 12B. Electrodes 25 form a capacitor. A via 28 connects buried electrode 25 to bond pad 32 on outer surface 18B. A circuit line 26 is located on surface 12A. Via 28 connects an end of circuit line 26 to bond pad 32 on outer surface 18B. Bond pads 32 can connect to a semiconductor device if desired. A resistor 27 is shown on surface 18B. Circuit lines 26, bond pads 32 and vias 28 connect with other circuit lines (not shown) or components (not shown) on the LTCC device 10. The circuit features on layers 12 and 18 are made from conventional thick film conductor materials and are applied by conventional thick film screening and curing techniques. These circuit features and components on layers 12 and 18 are patterned in a high density configuration with small dimensions and have to be held to precise tolerances for post-fire processing. If shrinkage is not precisely controlled, post-fire materials or placed components will be mis-registered, resulting in an electrical open or short.

After circuit features have been applied to layers 12 and 18, ceramic core 15 is stacked on layer 18 and layer 12 is stacked or laminated on top of ceramic core 15 to form assembly 10. Assembly 10 is then fired in a furnace to form assembly 10. Again, these circuit features and components have to be held to precise registration and tolerance. In the case of a mis-alignment among the circuit components, an open or a short may result. The combination of the ceramic core 15 between the layers 12 and 18 causes a change in the shrinkage rate of the layers 12 and 18 during firing. Layers 12 and 18 shrink only 0.8 to 1.2 percent in the x and y axes during firing. Layers 12 and 18 do not shrink at their normal 10 to 12 percent rate in the z-axis direction. Layers 12 and 18 shrink at a much higher rate in the z-axis of about 40 to 60 percent in order to arrive at a normal density after firing. Layers 12 and 18 shrink as to conserve mass. The layers 12 and 18 shrink during firing to maintain a normal fired density of greater than 90 percent of the theoretical fully compacted density. The ceramic core 15 maintains its fired dimensions or shrinks slightly on the order of 0.8 to 1.2 percent in the x, y and z axes. Ceramic core 15 constrains the shrinkage of layers 12 and 18 to that of the ceramic core 15 in the x and y directions. The resulting assembly 10 after firing is able to have higher densities, smaller dimensions and to better hold registration and tolerances for circuit features placed on layers 12, 14, 16 and 18. The better registration results in improved yields, better quality, less rejects, less scrap and lower costs of manufacturing.

LTCC assembly 10, of FIGS. 1 and 2 can be assembled as follows: The first step is to punch vias 28 into layers 12, 14, 16 and 18. The vias 28 are then screen filled with a conductive material on each of layers 12, 14, 16 and 18. Next, electrodes 25, resistors 27, circuit lines 26, bond pads 32 and inductors 34 would be screened onto surfaces 12A, 12B, 14A, 14B, 16A, 16B, 18A and 18B. Layers 14 and 16 would be stacked and laminated under heat and pressure onto each other. Layers 14 and 16 are fired in a furnace at a temperature between 700 and 900 degrees Celsius to form ceramic core 15. Ceramic core 15 is stacked onto layer 18 and layer 12 is stacked onto ceramic core 15. Next, Layers 12, 18 and core 15 are laminated under heat and pressure. Layers 12, 18 and ceramic core 15 are fired in a furnace at a temperature between 700 and 900 degrees Celsius to complete assembly 10.

Variations of the Preferred Embodiment(s)

One of ordinary skill in the arts electronic packaging and electronic ceramics, will realize many advantages from using the preferred embodiment. Further, one of ordinary skill in the art will realize that there are many different ways of accomplishing the preferred embodiment. For example, it is contemplated that more than two layers 14 and 16 could be stacked to form core 15. Similarly, more than two layers 12 and 18 could be stacked on core 15. It also is possible to stack several units of assembly 10 on each other and then fire the overall unit.

The embodiment shows the use of vias 28 to make electrical connections. Other electrical connections could be used such as pressed in pins.

Even though the embodiment discusses the use of low temperature co-fired ceramics, other ceramics could be used such as high temperature ceramics.

Even though the embodiment discusses the use of certain circuit features, other circuit features or passive components could be used such as waveguides, surface acoustic devices, resonators, or mixers. Further, it is contemplated that semiconductor devices could be mounted on the outer surfaces 12A or 18A. Semiconductor devices could also be buried within the layers of assembly 10.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed and desired to be secured by Letters Patent is:

1. A method of making a multilayered low temperature co-fired ceramic assembly with high density circuit features, comprising:

a) providing at least a first and a second ceramic layers;

b) punching a plurality of via holes in the first and second ceramic layers;

c) filling the via holes of the first and second ceramic layers with a conductive material;

d) screen printing a plurality of low density circuit features on the first and second layers;
e) stacking the first ceramic layer onto the second ceramic layer;
f) firing the first and second ceramic layers in a first firing cycle such that a ceramic core is formed;
g) providing at least a third and a fourth ceramic layer;
h) punching a plurality of via holes in the third and fourth ceramic layers;
i) filling the via holes of the third and fourth ceramic layers with a conductive material;
j) screen printing a plurality of high density circuit features on the third and fourth ceramic layers;
k) stacking the ceramic core onto the fourth ceramic layer and stacking the third ceramic layer onto the ceramic core; and
l) firing the third and fourth ceramic layers and the ceramic core in a second firing cycle such that the assembly is formed, the assembly having high density circuit features.

2. The method of making a multilayered low temperature co-fired ceramic assembly according to claim 1, wherein the circuit features are selected from the group consisting of:

a) resistors;
b) capacitors;
c) circuit lines;
d) vias;
e) inductors; or
f) bond pads.

3. The method of making a multilayered low temperature co-fired ceramic assembly according to claim 2, wherein the assembly is fired at a temperature between 700 and 900 degrees Celsius.

4. The method for making a multilayered low temperature co-fired ceramic assembly according to claim 2, wherein the ceramic core shrinks in three axes during firing.

5. The method of making a multilayered low temperature co-fired ceramic assembly according to claim 2, wherein the third and fourth ceramic layers shrink during firing 0.8% to 1.2% along an axis parallel to the third and fourth layers.

6. The method of making a multilayered low temperature co-fired ceramic assembly according to claim 2, wherein the third and fourth ceramic layers shrink during firing 40% to 60% along an axis perpendicular to the third and fourth layers.

* * * * *